United States Patent
Kraus et al.

(10) Patent No.: US 10,627,462 B2
(45) Date of Patent: Apr. 21, 2020

(54) CABLE ARRANGEMENT FOR USE IN A MAGNETIC RESONANCE LOCAL COIL

(71) Applicants: Wolfgang Kraus, Nürnberg (DE);
Thomas Kundner, Buckenhof (DE);
Martin Zigann, Möhrendorf (DE);
Stephan Zink, Erlangen (DE)

(72) Inventors: Wolfgang Kraus, Nürnberg (DE);
Thomas Kundner, Buckenhof (DE);
Martin Zigann, Möhrendorf (DE);
Stephan Zink, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 188 days.

(21) Appl. No.: 15/640,734

(22) Filed: Jul. 3, 2017

(65) Prior Publication Data
US 2018/0011154 A1  Jan. 11, 2018

(30) Foreign Application Priority Data
Jul. 7, 2016 (DE) .......... 10 2016 212 421

(51) Int. Cl.
*G01R 33/36* (2006.01)
*G01R 33/34* (2006.01)
*G01R 33/341* (2006.01)

(52) U.S. Cl.
CPC ..... *G01R 33/34084* (2013.01); *G01R 33/341* (2013.01); *G01R 33/34007* (2013.01); *G01R 33/36* (2013.01)

(58) Field of Classification Search
CPC .............. G01R 33/543; G01R 33/5608; G01R 33/4828

USPC .......... 324/307, 309, 318, 322, 314
See application file for complete search history.

(56) References Cited

U.S. PATENT DOCUMENTS

| | | | | |
|---|---|---|---|---|
| 2004/0100346 A1* | 5/2004 | Jevtic | ......... | G01R 33/34046 335/299 |
| 2007/0001676 A1* | 1/2007 | Schilling | ......... | G01R 33/34007 324/322 |
| 2009/0261828 A1* | 10/2009 | Nordmeyer-Massner | ......... | G01R 33/34046 324/318 |
| 2009/0299168 A1* | 12/2009 | Ehman | ......... | A61B 5/055 600/410 |

(Continued)

FOREIGN PATENT DOCUMENTS

| DE | 102005030745 A1 | 1/2017 | |
|---|---|---|---|
| DE | 102015218749 A1 | 3/2017 | |
| WO | WO-2016034364 A1 * | 3/2016 | ......... A61B 5/055 |

OTHER PUBLICATIONS

German Office Action for German Application No. 102016212421.8, dated May 28, 2017, with English Translation.

*Primary Examiner* — Patrick Assouad
*Assistant Examiner* — Taqi R Nasir
(74) *Attorney, Agent, or Firm* — Lempia Summerfield Katz LLC

(57) ABSTRACT

An antenna of a cable arrangement is provided for use in an MR local coil. An MR local coil with such a cable arrangement and a method for producing such a cable arrangement are provided. The cable arrangement includes an electrical conductor, which may have a material with a high electrical conductivity, such as copper for instance. The cable arrangement, in particular the electrical conductor, is embodied in a wavelike manner (e.g., the cable arrangement has a waveform).

15 Claims, 5 Drawing Sheets

(56) References Cited

U.S. PATENT DOCUMENTS

| | | | |
|---|---|---|---|
| 2010/0137969 A1* | 6/2010 | Rakos | A61F 2/06 623/1.13 |
| 2010/0148779 A1* | 6/2010 | Yin | G01R 33/3858 324/322 |
| 2010/0244824 A1* | 9/2010 | Jiang | G01R 33/3802 324/309 |
| 2013/0137969 A1* | 5/2013 | Jones | A61B 5/055 600/421 |
| 2013/0312897 A1* | 11/2013 | Vowles | A61B 17/0401 156/83 |
| 2014/0287927 A1* | 9/2014 | Swaffield | B29C 45/14639 505/211 |
| 2016/0018489 A1* | 1/2016 | Farivar-Mohseni | G01R 33/34084 600/422 |
| 2017/0089991 A1 | 3/2017 | Gruber et al. | |
| 2017/0252578 A1* | 9/2017 | Halkola | A61B 5/055 |

* cited by examiner

CABLE ARRANGEMENT FOR USE IN A MAGNETIC RESONANCE LOCAL COIL

RELATED CASE

This application claims the benefit of DE 102016212421.8, filed on Jul. 7, 2016, which is hereby incorporated by reference in its entirety.

BACKGROUND

The present embodiments relate to a cable arrangement for use in a magnetic resonance (MR) local coil, an MR local coil with such a cable arrangement, and a method for producing such a cable arrangement.

Imaging methods aid in medical technology. For example, imaging by MR, also known as magnetic resonance tomography (MRT), is distinguished by high and variable soft tissue contrast levels. High-frequency electromagnetic magnetic resonance signals are received by electrically conducting loops, known as coils and/or antennae. Upon receipt, a voltage is induced in the coil by the magnetic resonance signal. These receive coils may be arranged as close as possible to an examination object, in particular a patient. The receive coils are therefore also referred to as MR local coils. The induced voltage may be forwarded amplified to the receive electronics by a low-noise preamplifier.

In order to be able to position an MR local coil as close as possible to the patient, it would be advantageous if it is well adjusted to the geometry of the patient. Conventional MR local coils are however often inadequate. If a dynamic three-dimensional remolding of the MR local coil is required for instance, in most cases this does not mold itself to the patient, but the MR local coil instead juts out and/or is under excessive stress such that damage may result in complete failure.

SUMMARY AND DESCRIPTION

The object underlying the present embodiments is to improve the geometric adjustability of MR local coils.

A cable arrangement for use in an MR local coil is proposed. The cable arrangement includes an electrical conductor, which may have a material with a high electrical conductivity, such as copper for instance. In such cases, the cable arrangement, in particular the electrical conductor, is embodied in a wavelike manner (e.g., the cable arrangement has a waveform).

The cable arrangement typically includes a longitudinal direction and at least one transverse direction that runs perpendicular to the longitudinal direction. Along the longitudinal direction the cable arrangement typically has its largest extent, as a result of which the longitudinal direction may also be referred to as main extension direction.

The longitudinal direction may be aligned in parallel to a curve, which runs through a number of averaging points. The number of averaging points are each determined by a spatial averaging of a respective section of the electrical conductor.

One possible mathematical formulation of a position vector $\vec{r}_n$, which describes the position of an averaging point for a section $S_n$, is given by:

$$\vec{r}_n = \frac{1}{V_n} \int_{S_n} \vec{r} \, dV$$

A spatial integral is formed here by way of the position vectors $\vec{r}$ of all points of the electrical conductor in a section $S_n$ across the volume elements $dV$ and is standardized to the volume $V_n$ of the section $S_n$.

A waveform typically has a wave that repeats periodically. In such cases, the sections of the electrical conductor are advantageously selected such that the sections include at least one period length.

A waveform may be understood to be a geometric shape, the boundaries of which run variantly and/or alternately on various sides of one or a number of parallel reference lines. As a result, a number of wave crests may form and a wave trough forms for each wave crest in each case. For instance, a first half wave runs above a reference line as a wave crest and a subsequent half wave runs below the reference line as a wave trough.

Here, the one or number of parallel reference lines may be substantially in parallel to the longitudinal direction of the cable arrangement and/or to the net flow direction of a current, which may be inducted by receiving a magnetic resonance signal in the MR local coil. The counter-rotating portions of the current may compensate for one another in the wave crests and wave troughs.

With a wavelike electrical conductor, the wave crests have maximum lines and the wave troughs have minimum lines. The first expansion direction may be oriented in parallel to the maximum lines and/or minimum lines. The distance between the minimum line and the maximum line may be the amplitude of the waveform.

The waveform advantageously causes a spring effect that brings about a resetting force. A spring and/or flexible cable arrangement may be generated, with which previously impossible three-dimensional moldings on patient geometries may be achieved. Adaptive MR local coils may thus be realized.

Contrary to other embodiments of flexible cable arrangements, such as for instance when tension or compression springs are used, a waveform avoids additional inductances that modify themselves by way of an expansion. The electrical ratios thus remain constant, as a result of which an electrical balance of the MR local coil is facilitated.

The cable arrangement may further include an elastic carrier (e.g., the carrier is advantageously embodied to revert back to its original form if a force causes its shape to change and if the acting force is eliminated). In particular, the elastic carrier is linear-elastic (e.g., the deformation of the elastic carrier is linear to the mechanical stress which is acting on the elastic carrier). The elastic carrier is advantageously particularly reversible, flexible and/or compressible and/or elastic. In particular, the carrier is embodied to be elastic along the longitudinal direction of the cable arrangement.

The elastic carrier may include an elastic material (e.g., the carrier material), in particular its atomic and/or molecular structure, which may provide for a resetting into the original form.

The electrical conductor may be arranged in parallel, at least in sections, to the elastic carrier (e.g., the surfaces of the electrical conductor and the elastic carrier run substantially in parallel).

One embodiment provides that the electrical conductor is connected in a two-dimensional manner to the elastic carrier.

The electrical conductor and the elastic carrier may be bounded by their surfaces. The electrical conductor may have a first surface and the elastic carrier may have a second surface. At least one part of the first surface is connected to at least one part of the second surface (e.g., the surfaces touch one another and/or are in contact). In such cases, the part of the first surface that is connected to the part of the second surface forms one or a number of connecting surfaces.

In this context, a two-dimensional connection is then especially present if at least one of the one or number of connecting surfaces is larger, in particular more than 10 times larger, than a cross-sectional surface of the electrical conductor. The cross-sectional surface may be oriented perpendicular to the longitudinal direction of the cable arrangement.

The one or number of connecting surfaces may include more than 30%, more than 50%, or 100% of the first and/or second surface. In one case, the entire surface of the electrical conductor is therefore connected to the surface of the elastic carrier, and/or the entire surface of the elastic carrier is connected to the surface of the electrical conductor.

A two-dimensional connection may be construed here compared to a point-shaped connection, in which a connection exists between the electrical conductor and the elastic carrier only at specific, in particular non-cohesive points, for instance. A two-dimensional connection may provide a particularly good geometric adjustment of the electrical conductor to a patient geometry, because the reset forces of the elastic carrier may be transmitted particularly effectively onto the electrical conductor.

Moreover, any mechanical load of the cable arrangement is not only absorbed by the electrical conductor, the mechanical load is instead also distributed onto the elastic carrier. The elastic carrier may thus also absorb possible overstresses of the electrical conductor.

The electrical conductor may be connected by positive fit with the elastic carrier. A positive-fit connection, which may be generated by adhesion and/or coating for instance, is then particularly present if the connecting partners are held together by atomic or molecular forces. A positive-fit connection permits a particularly effective force transmission between the electrical carrier and the electrical conductor.

The electrical conductor may be embodied in a planar manner, at least in sections (e.g., the electrical conductor is embodied to be two-dimensional and/or has at least one two-dimensional section). In this two-dimensional section, the surface of the electrical conductor has at least one, in most instances two parallel, two-dimensional areas. Such an embodiment supports the elasticity of the cable arrangement.

The rectangular cross-sectional surface of the electrical conductor may have a first expansion direction and a second expansion direction perpendicular thereto.

The first expansion direction may be significantly larger, (e.g., more than 2 times larger, more than 5 times larger, or more than 10 times larger), than the second expansion direction.

The boundary of the cross-sectional surface of the electrical conductor parallel to the first expansion direction is also substantially straight.

With a planar embodiment, the electrical conductor may be slightly bent about the first expansion direction and permits a good geometric adjustment at least in this direction.

The electrical conductor may be a solid flat cable at least in sections. A solid flat conductor offers improved electrical properties, in particular a lower electrical resistance, compared with a stranded wire.

One embodiment provides that the elastic carrier is arranged on at least two opposing sides of the electrical conductor. In particular, with a planar electrical conductor, the elastic carrier is arranged on different sides of the two-dimensional area of the surface of the electrical conductor (e.g., parallel to the second expansion direction of the cross-sectional surface of the electrical conductor, the cable arrangement has a series of a first part of the elastic carrier, the electrical conductor and a second part of the elastic carrier).

The resetting force of the elastic carrier may be effectively transmitted to the electrical conductor by a two-sided arrangement.

The cable arrangement may have a neutral fiber, in which the electrical conductor is disposed. Any fiber and/or layer of the cable arrangement may be understood to be a neutral fiber, often also known as zero line, the length of which does not change when the cable arrangement is twisted or bent.

For instance, this may be the case if the electrical conductor is disposed centrally between two parts of the elastic carrier. The two-dimensional area of its surface is oriented parallel to the neutral fiber particularly in the case of a planar electrical conductor.

An arrangement of the electrical conductor of this type in the neutral fiber permits a particularly effective absorption of any mechanical stresses by the elastic carrier instead of by the electrical conductor.

A further embodiment of the cable arrangement provides that the electrical conductor is arranged on at least two opposing sides of the elastic carrier. This design permits further advantageous possibilities of producing the cable arrangement, such as an electroplating of the electrical conductor.

One further embodiment of the cable arrangement provides that the electrical conductor and/or the elastic carrier are encased at least partially by the elastic carrier and/or by the electrical conductor in each case. An encasing, in particular a complete encasing, may be carried out using various manufacturing methods.

The elastic carrier may include a plastic, in particular a thermoplastic and/or duroplastic and/or elastomeric plastic. A plastic is understood here to mean a substance that includes organic macromolecules.

Thermoplastic plastics, in particular polyimide (PI) and/or polyoxymethylene (POM), may have a good MR compatibility and a good processability, particularly with injection molding methods.

Similarly, duroplastic plastics in most cases have a good MR compatibility, whereas elastomeric plastics are distinguished on account of their outstanding elastic properties.

A further embodiment provides that the cable arrangement includes a tissue, wherein the tissue includes at least two longitudinal threads and/or a number of transverse threads.

The longitudinal threads may be arranged substantially in parallel to the longitudinal direction of the cable arrangement. The transverse threads may be arranged substantially perpendicular to the longitudinal direction of the cable arrangement. Each transverse thread may be connected to two longitudinal threads. With a wavelike cable arrangement, the transverse threads may be arranged alternately in wave crests and wave troughs, in particular parallel to the maximum and minimum lines.

At least one part of the longitudinal thread is advantageously elastic, so that this causes a resetting force when the cable arrangement is expanded in the longitudinal direction.

A further variant provides that at least one part of the longitudinal thread is embodied to provide tensile strength. If the cable arrangement is lengthened, the tissue, in particular the longitudinal thread, only extends up to a maximum length and thus protects the cable arrangement from overload. Advantageously the tissue, in particular a longitudinal thread of the tissue which provides tensile strength, includes aramid, because this substance has a particularly high tensile strength.

The transverse threads that in particular provides tensile strength and/or are elastic serve in particular to arrange and/or fasten the tissue to the cable arrangement.

Furthermore, it is proposed that the cable arrangement includes a rigid housing, in which the electrical conductor is arranged. In such cases, the rigid housing delimits the expansion of the electrical conductor (e.g., the housing serves as a stop in order to protect the electrical conductor from an overexpansion).

A further embodiment provides that the cable arrangement has an encasing with a foamed material. The electrical conductor and the elastic carrier may be molded and/or injection-molded and/or encased in particular directly with foam or suchlike. The encasing provides in particular a safety distance from the patient.

Furthermore, an MR local coil is proposed with at least one cable arrangement according to one of the embodiments described above, the advantages and features of which may also be transferred accordingly to the MR local coil.

In particular, the MR local coil may include a protective sheath, in order in particular to provide a safety distance from the patient, but also to provide biocompatibility and/or easy cleaning. The cable arrangement is advantageously arranged in the protective sheath. In particular the cable arrangement may be placed in the protective sheath during use. This advantageously includes, depending on use, an expandable material, such as \ foam, compound, granulate, and/or a liquid.

Moreover, a method for producing a cable arrangement for use in an MR local coil is proposed. In such cases, an electrical conductor is connected to an elastic carrier by a hot stamping method, for instance. To this end, a three-dimensional hot stamping tool may be used. The tool provides a desired waveform for instance. In particular, the hot stamping process includes a lamination process with a cooling connected thereto. The hot stamping process is suited for instance to baking an, in particular planar, electrical conductor, which is copper for instance, with an elastic carrier, which is polyimide for instance. In such cases, a sandwich structure may be used for instance (e.g., polyimide top layer/copper conductor/polyimide top layer).

Furthermore, it is proposed that an electrical conductor is electroplated to an elastic carrier. For instance, copper may be applied to the elastic carrier in a desired thickness, as required.

Prior to electroplating the electrical conductor to the elastic carrier, the elastic carrier is advantageously introduced in a waveform.

Advantageously, the electrical conductor and/or the elastic carrier is injection molded in a further act. Foam may be applied particularly easily by an injection method.

BRIEF DESCRIPTION OF THE DRAWINGS

Further advantages, features and details are disclosed in the exemplary embodiments described below and with the aid of the drawings. Parts which correspond to one another are provided with the same reference characters in all the figures.

DETAILED DESCRIPTION OF EXEMPLARY EMBODIMENTS

Figure 10:
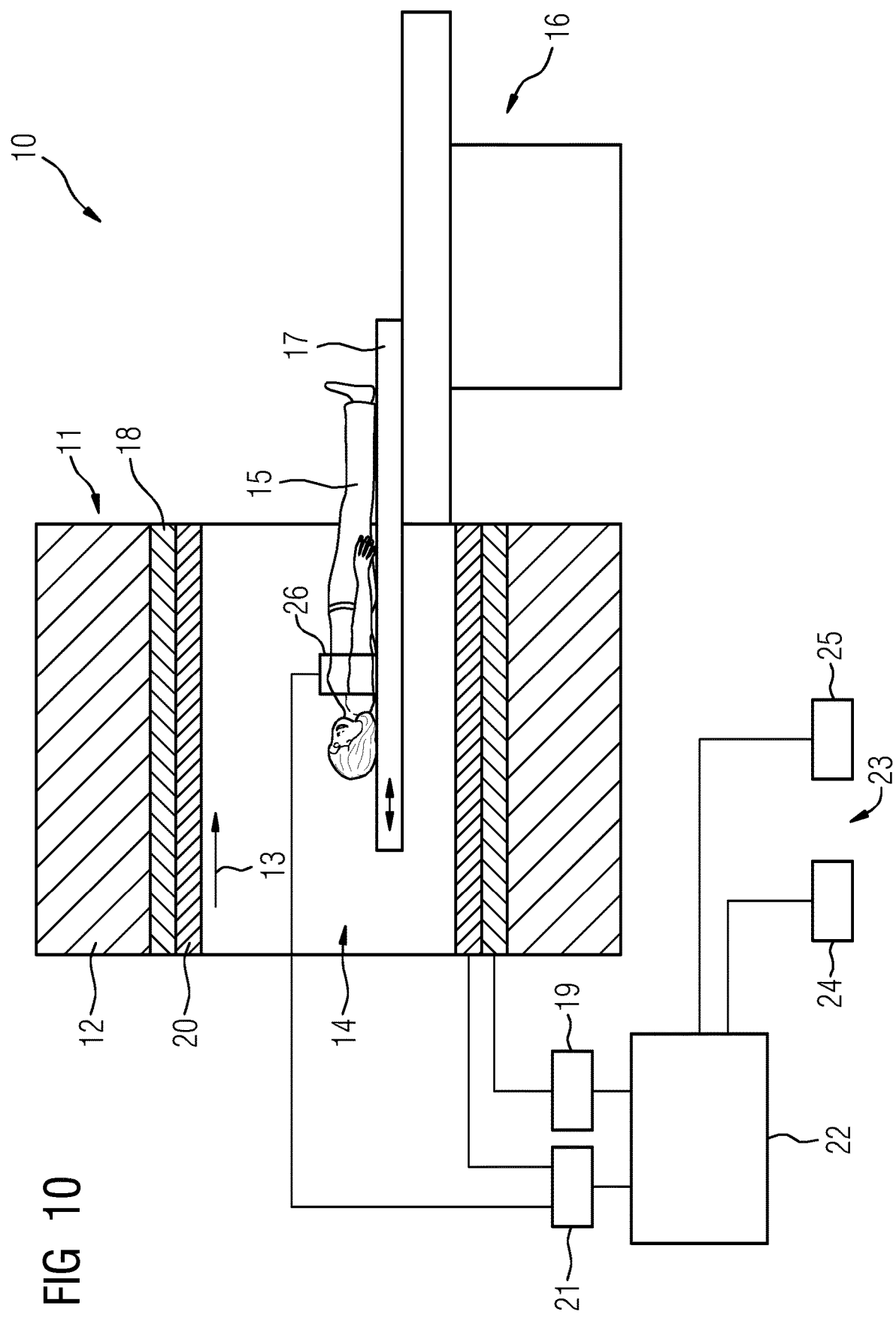
FIG. 10 shows an exemplary magnetic resonance apparatus with an MR local coil in a schematic representation.

FIG. 10 shows a schematic representation of a magnetic resonance apparatus 10. The magnetic resonance apparatus 10 includes a magnet unit 11 that has a main magnet 12 for generating a strong and in particular temporally constant main magnetic field 13. Moreover, the magnetic resonance apparatus 10 includes a patient receiving area 14 for receiving a patient 15. In the present exemplary embodiment, the patient receiving area 14 is embodied to be cylindrical and in a peripheral direction is surrounded by the magnet unit 11 in the manner of a cylinder. In principle, however, a configuration of the patient receiving area 14 deviating therefrom is readily conceivable. The patient 15 may be pushed into the patient receiving area 14 by a patient support apparatus 16 of the magnetic resonance apparatus 10. For this purpose, the patient support apparatus 16 has a patient couch 17 configured to be movable within the patient receiving area 14.

The magnet unit 11 also has a gradient coil unit 18 for generating magnetic field gradients that are used for position encoding during imaging. The gradient coil unit 18 is controlled by a gradient control unit 19 of the magnetic resonance apparatus 10. The magnet unit 11 further includes a high frequency antenna unit 20, which, in the present exemplary embodiment, includes a body coil and an MR local coil 26 that are fixedly integrated in the magnetic resonance apparatus 10 and arranged locally on the body of the patient 15, respectively. The high frequency antenna unit 20 is configured to excite atomic nuclei situated in the main magnetic field 13 generated by the main magnet 12. The high frequency antenna unit 20 is controlled by a high frequency antenna control unit 21 of the magnetic resonance apparatus 10 and radiates high frequency magnetic resonance sequences into an examination space substantially formed by a patient receiving area 14 of the magnetic resonance apparatus 10. The high frequency antenna unit 20, in particular the MR local coil 26, is also embodied to receive magnetic resonance signals.

The magnetic resonance apparatus 10 has a system control unit 22 for controlling the main magnet 12, for controlling the gradient control unit 19, and for controlling the high frequency antenna control unit 21. The system control unit 22 centrally controls the magnetic resonance apparatus 10, such as for example the performance of a predetermined imaging gradient echo sequence. Furthermore, the system control unit 22 includes an evaluation unit, not disclosed in detail, for evaluating medical image data acquired during the magnetic resonance examination. Furthermore, the magnetic resonance apparatus 10 includes a user interface 23 connected to the system control unit 22. Control information, such as, for example, imaging parameters and reconstructed magnetic resonance images, may be displayed on a display unit 24, for example on at least one monitor, of the user interface 23 for medical operating personnel. In addition, the user interface 23 has an input unit 25 by which information and/or parameters may be input by the medical operating personnel during a scanning procedure.

Figure 8:
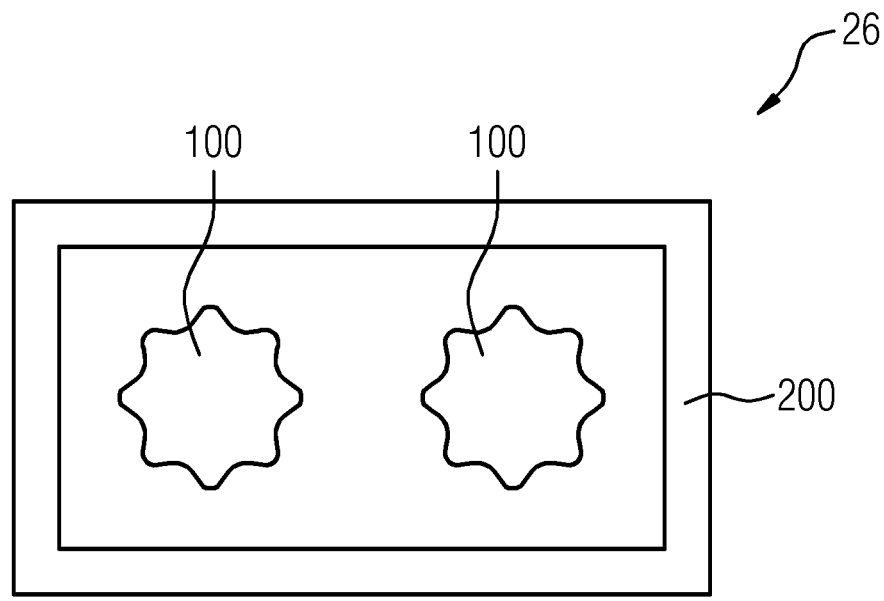
FIG. 8 shows an exemplary MR local coil with an optional protective sheath in a schematic representation.

FIG. 8 shows a schematic representation of an MR local coil 26. In this example, the MR local coil 26 includes two cable arrangements 100 with, in each case, one electrical conductor forming a closed loop. The cable arrangements 100 may function in particular as antenna elements for receiving magnetic resonance signals.

To provide a safety distance from the patient 15, but also biocompatibility and cleanability, the cable arrangement 100 may be placed in a protective sheath 200. According to requirements, the sheath 200 may include an expandable material, for instance, such as foam, compound and/or granulate, and/or a liquid, etc. Embodiments of the MR local coil without a protective sheath are however also possible.

Figure 1:
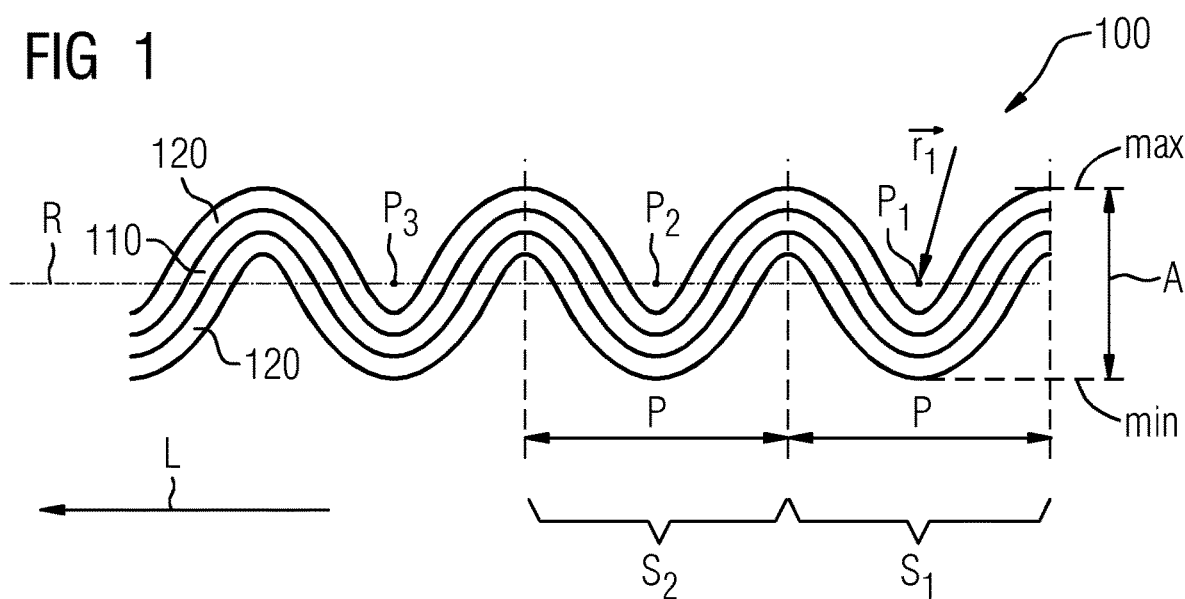
FIG. 1 shows an exemplary cable arrangement with an elastic conductor, which is surrounded by an elastic carrier, at least partially, in a schematic representation.

FIG. 1 shows an antenna cable arrangement 100 for use in an MR local coil 26. In such cases, the cable arrangement 100 includes, aside from an electrical conductor 110 of copper for instance, an elastic carrier 120, which has plastic, in particular polyimide (PI) and/or polyoxymethylene (POM), for instance.

The cable arrangement 100 is embodied to be wavelike (e.g., it has a waveform). The waveform of the cable arrangement 100 has a number of wave crests and wave troughs along a longitudinal direction L that repeat periodically, here at intervals of a periodic length P. The wave crests are disposed above a reference line R and the wave troughs there below. The waveform also has an amplitude A, namely a distance between a maximum length max of a wave crest in relation to a minimum length min of a wave trough.

If a cable arrangement 100 thus structured is expanded in parallel to the longitudinal direction L, the waveform flattens (e.g., the amplitude A becomes smaller). The elastic carrier provides for a resetting into the original waveform.

The reference line R parallel to the longitudinal direction L runs through a number of averaging points $P_1$, $P_2$, $P_3$, wherein the number of averaging points $P_1$, $P_2$, $P_3$ are each by a spatial averaging of a respective section $S_1$, $S_2$ of the electrical conductor. Here the sections $S_1$, $S_2$ include a period length P. An averaging point $P_1$, $P_2$, $P_3$ may be described by a position vector such as for instance the averaging point $P_1$, by the position vector $\vec{r}_1$. One possible mathematical formulation for $\vec{r}_n$ is:

$$\vec{r}_n = \frac{1}{V_n} \int_{S_n} \vec{r} \, dV$$

In such cases, $V_n$ is the volume and r is the position vectors of the electrical conductor 110 in section $S_n$.

Figure 2:
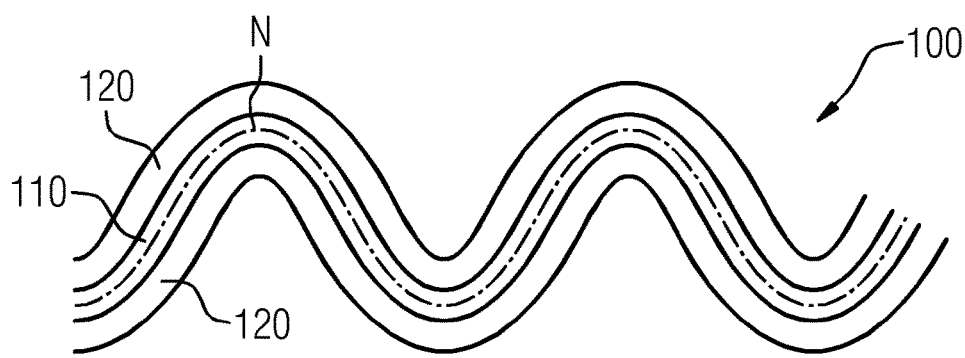
FIG. 2 shows a further exemplary cable arrangement with an electrical conductor, which is arranged in a neutral fiber, in a schematic representation.

As in FIG. 1, the elastic carrier 120 in FIG. 2 is also arranged on two opposing sides of the electrical conductor 110. Furthermore, a neutral fiber N is shown in FIG. 2, in which the electrical conductor 110 is disposed. As a result, the mechanical load is received predominantly by the elastic carrier 120 when expanded.

Figure 3:
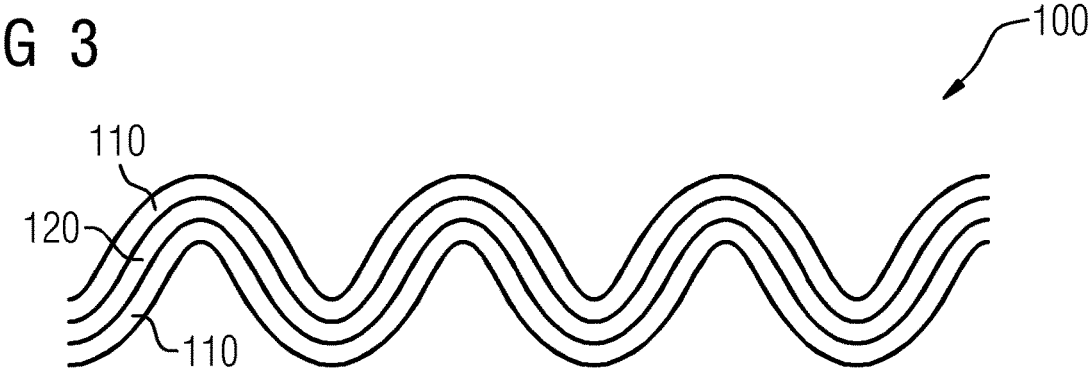
FIG. 3 shows a further exemplary cable arrangement with an elastic carrier, which is surrounded by an electrical conductor, at least partially, in a schematic representation.

In the example shown in FIG. 3, the electrical conductor 110 is arranged on two opposing sides of the elastic carrier 120.

Therefore FIGS. 1 to 3 in particular show exemplary cable arrangements 100, in which the electrical conductor 110 and/or the elastic carrier 120 are at least partially encased by the elastic carrier 120 and/or the electrical conductor 110 in each case. Furthermore, the electrical conductor 110 is connected in a two-dimensional manner with the elastic carrier 120.

Figure 4:
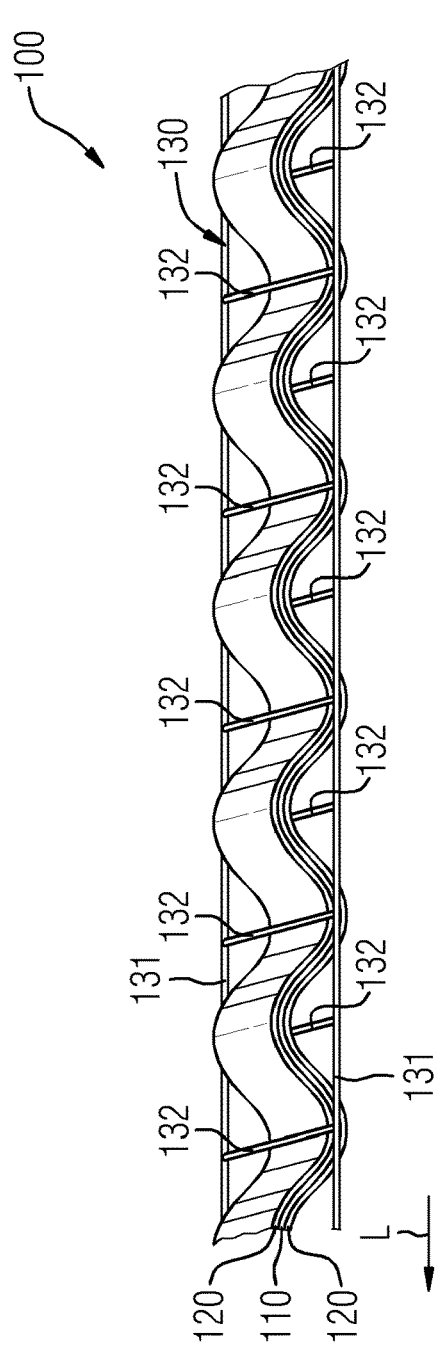
FIG. 4 shows a further exemplary cable arrangement with a tissue in a first expansion state in a schematic representation.
Figure 5:
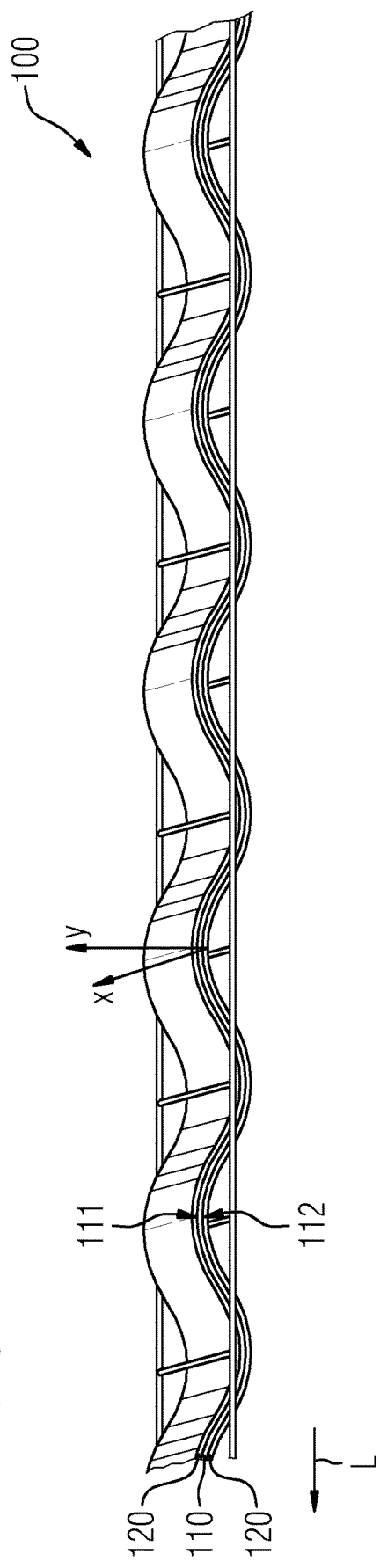
FIG. 5 shows a further exemplary cable arrangement with a tissue in a second expansion state in a schematic representation.

FIGS. 4 and 5 show a development of the cable arrangement 100, which here includes a tissue 130 with two longitudinal threads 131 and a number of transverse threads 132. In such cases, the number of transverse threads 132 are arranged alternately in wave crests and wave troughs of the wavelike cable arrangement 100. The cable arrangement 100 is compressed in FIG. 4, whereas it is extended in FIG. 5. The tissue 130 may advantageously be expanded up to a maximum length for instance by using an aramid yarn that provides tensile strength as a longitudinal thread 131, so that the tissue 130 protects the electrical conductor 110 from an overload.

By way of example, FIGS. 4 and 5 show the electrical conductor 110 surrounded by the elastic carrier 120 (e.g., the electrical conductor 110 is internal). It is however also possible for the elastic carrier 120 to be surrounded by the electric carrier 110.

Figure 6:
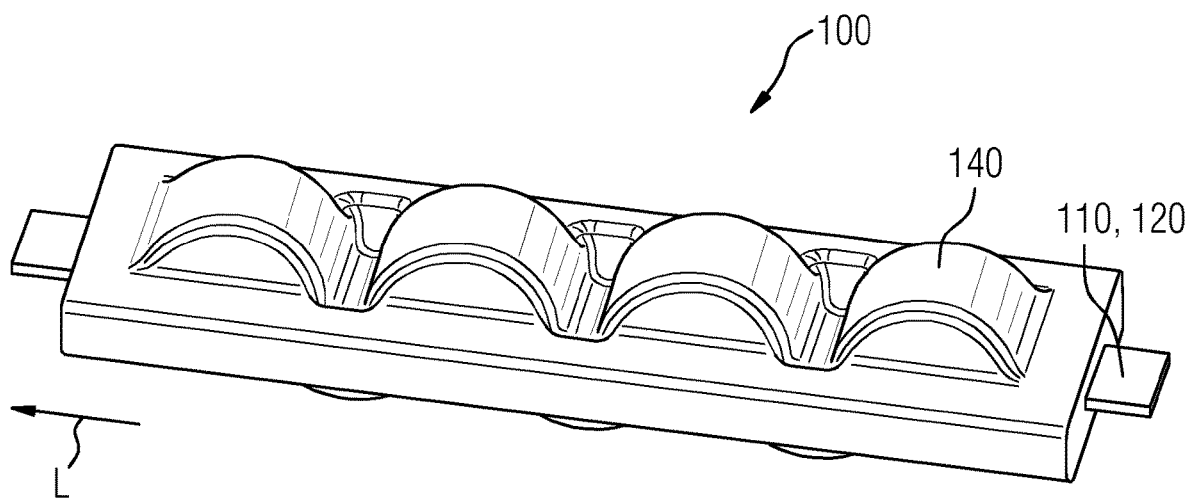
FIG. 6 shows a further exemplary cable arrangement with an encasing in a schematic representation.
Figure 7:
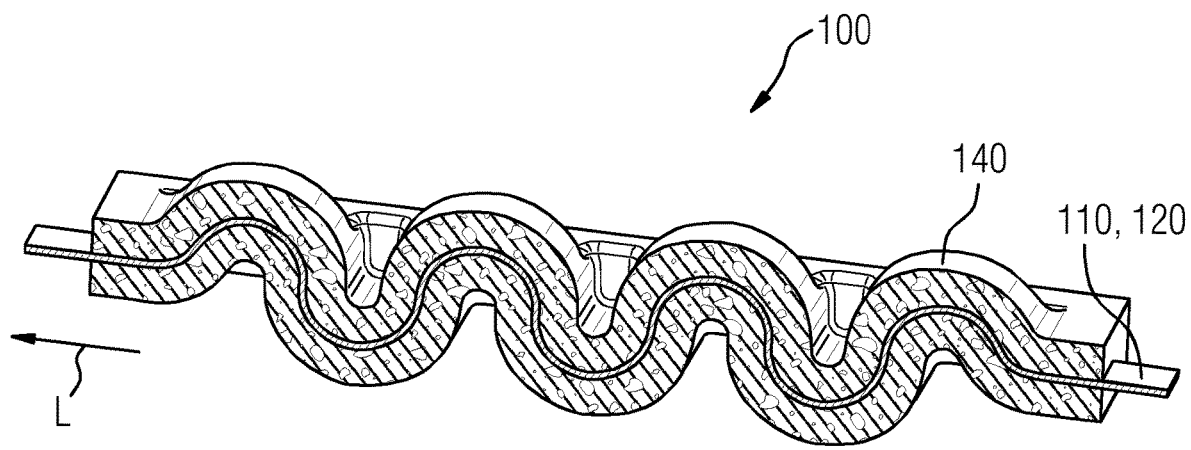
FIG. 7 shows a further exemplary cable arrangement with an encasing in a schematic cross-sectional representation.

A further development of the cable arrangement 100 is shown in FIGS. 6 and 7. Here the cable arrangement 100 has an encasing 140 with a foamed material.

The perspective views in FIGS. 4 to 7 also show that the electrical conductor 110 may be embodied in a planar manner. As shown by way of example in FIG. 5, the wavelike surface of the electrical conductor 110 has two parallel two-dimensional areas 111 and 112.

The cross-sectional surface of the electrical conductor 110 has a first expansion direction x and a second expansion direction which is perpendicular thereto. The first expansion direction may be significantly larger than the second expansion direction in a planar embodiment of the electrical conductor 110.

Figure 9:
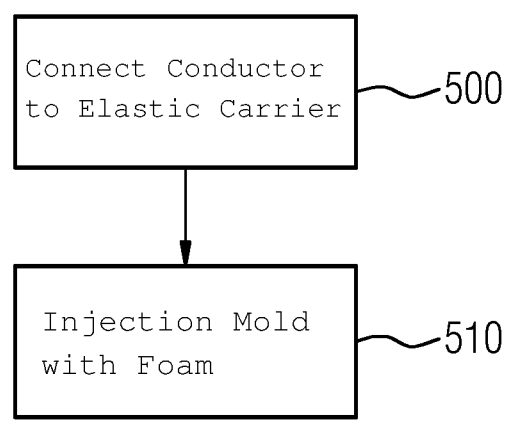
FIG. 9 shows an exemplary method for producing a cable arrangement in a block diagram.

FIG. 9 shows a method for producing a cable arrangement 100 for use in an MR local coil 26. In act 500, the electrical conductor 110 is connected to an elastic carrier 120 by a hot stamping process and/or an electrical conductor 110 is electroplated onto an elastic carrier 120.

For instance, a planar copper conductor with polyimide top layers is baked by the hot stamping process. Contrary to conventional manufacturing processes of planar flexible conductor boards, a three-dimensional hot stamping tool is advantageously used here. The stamping tool yields a desired waveform with the lamination process and after a cooling. The result behaves advantageously similarly to a spring (e.g., the result may be expanded and bent up to a certain degree and springs back into its original shape in a fully elastic manner).

When an electrical conductor 110 is electroplated onto an elastic carrier 120, this may not involve an already existing copper conductor, which is still only shaped, but instead may involve a carrier material, for instance plastic and/or another coatable, above all MR-suitable elastic material.

The carrier material is shaped depending on requirements (e.g., the thickness and/or the width and/or the wave amplitude is adjusted in order to generate the required reset force). The carrier 120 thus produced is either already conductive or is made to be conductive. Depending on requirements, copper or a similar material with a high electric conductivity is electroplated in the required thicknesses onto the elastic carrier.

In an optional act 510, the electrical conductor 110 and the elastic carrier 120, particularly with foam, is injection molded.

Finally, it is noted again that the method described above in detail and the pattern generation unit and magnetic resonance apparatus disclosed are merely exemplary embodiments that may be modified by a person skilled in the art in a wide variety of ways without departing from the scope of the disclosure. Further, the use of the indefinite article "a" or "an" does not preclude that the relevant features can also be present plurally. Similarly, the expression "unit" does not exclude the relevant components consisting of a plurality of cooperating subcomponents which can also be spatially distributed if required.

It is intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

The invention claimed is:

1. A cable arrangement for use in a magnetic resonance (MR) local coil, the cable arrangement comprising:
   an electrical conductor, wherein the electrical conductor has a wavelike shape in the MR local coil;
   a neutral fiber and the electrical conductor is disposed in the neutral fiber; and
   an elastic carrier on two opposing sides of the neutral fiber and electrical conductor.

2. The cable arrangement of claim 1, wherein the electrical conductor is connected to the elastic carrier in a two-dimensional manner.

3. The cable arrangement of claim 1, wherein the electrical conductor is at least partially encased by the elastic carrier.

4. The cable arrangement of claim 1, wherein the elastic carrier comprises plastic.

5. The cable arrangement of claim 1, wherein the electrical conductor is planar and wavelike shaped.

6. The cable arrangement of claim 1, further comprising:
   a tissue of at least two longitudinal threads, a number of transverse threads, or the at least two longitudinal threads and the number of transverse threads.

7. The cable arrangement of claim 6, wherein the transverse threads are arranged alternately in wave troughs and wave crests in the wavelike conductor.

8. The cable arrangement of claim 1, wherein the electrical conductor is planar and wavelike shaped, the electrical conductor having a width equal to or most of a width of the elastic carrier.

9. The cable arrangement of claim 1, wherein the cable arrangement is encased with an expandable foamed material.

10. A magnetic resonance (MR) local coil comprising:
    an antenna with an electrical conductor that is wavelike; and
    a tissue of at least two longitudinal threads, a number of transverse threads, or the at least two longitudinal threads and the number of transverse threads, wherein the transverse threads are arranged alternately in wave troughs and wave crests in the wavelike conductor.

11. The MR local coil of claim 10, further comprising:
    a protective sheath.

12. The MR local coil of claim 11, wherein the protective sheath comprises foamed material.

13. A method for producing a cable arrangement for use in a magnetic resonance (MR) local coil, the method comprising:
    connecting an electrical conductor to an elastic carrier by a hot stamping process, by electroplating, or by both the hot stamping process and the electroplating, wherein the electrical conductor is planar and wavelike shaped, the electrical conductor having a width equal to or most of a width of the elastic carrier; and
    positioning the connected electrical conductor and the elastic carrier in the MR local coil.

14. The method of claim 13, further comprising:
    injection molding the electrical conductor and the elastic carrier.

15. A cable arrangement for use in a magnetic resonance (MR) local coil, the cable arrangement comprising:
    an electrical conductor, wherein the electrical conductor has a wavelike shape in the MR local coil; and
    an elastic carrier;
    wherein the electrical conductor is planar and wavelike shaped, the electrical conductor having a width equal to or most of a width of the elastic carrier.

* * * * *